United States Patent [19]
Skupnjak et al.

[11] Patent Number: 4,785,423
[45] Date of Patent: Nov. 15, 1988

[54] CURRENT LIMITED EPLD ARRAY

[75] Inventors: Joseph A. Skupnjak, Folsom; Abid Asghar, Davis; Kirby S. Hallenbeck, Shingle Springs, all of Calif.

[73] Assignee: Intel Corporation, Santa Clara, Calif.

[21] Appl. No.: 5,927

[22] Filed: Jan. 22, 1987

[51] Int. Cl.$^4$ .................... G11C 7/00; G11C 11/34
[52] U.S. Cl. ..................................... 365/189; 365/185
[58] Field of Search ................ 365/94, 104, 185, 189, 365/242, 203, 207, 196

[56] References Cited
U.S. PATENT DOCUMENTS
4,371,956 2/1983 Maeda et al. ..................... 365/185

*Primary Examiner*—Joseph A. Popek
*Assistant Examiner*—Melissa J. Koval
*Attorney, Agent, or Firm*—Blakely, Sokoloff, Taylor & Zafman

[57] ABSTRACT

An improved architecture for an EPROM PAL utilizing two bit lines is disclosed. The drains of the EPROM cells of a given column of an array are coupled together to a first bit line. The first line is coupled to a sensing circuit. The sources of the EPROM cells are coupled together to a second bit line which is then coupled through a current limiting transistor. The gate of the transistor is coupled to the first bit line to receive a feedback signal for controlling the current on the bit lines. The current limiting feature provides for shorter transition periods between "on" and "off" states which results in an improved speed performance of the device.

7 Claims, 2 Drawing Sheets

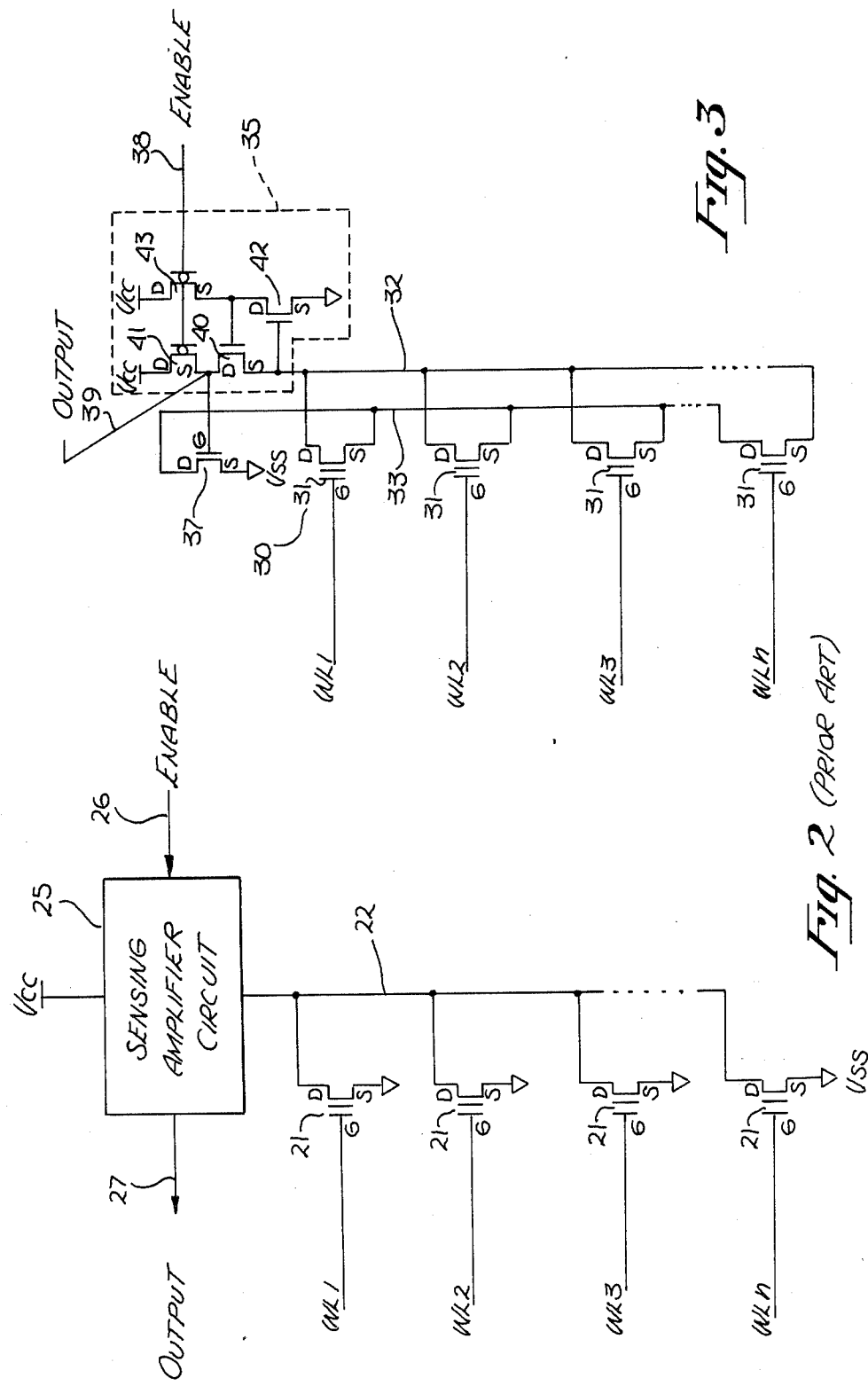

CURRENT LIMITED EPLD ARRAY

BACKGROUND OF THE INVENTION

1. Field of the Invention.

The present invention relates to the field of erasable programmable logic devices and more specifically to current limiting in EPROM arrays

2. Prior Art.

The manufacture and use of electrically programmable read only memories (EPROMs) are a well-known technology in the prior art. Recently, EPROM devices have been combined with programmable logic arrays, or a programmable array logic (PAL), and have provided a new advancement in the area of erasable programmable logic devices (EPLD). A typical EPLD array architecture is disclosed in the U.S. Patent to Hartmann et al., U.S. Pat. No. 4,609,986 Such array architecture utilizes a plurality of EPROM cells which are arranged in a row and column array structure. Although the speed performance of an EPLD device is determined by various properties of the device, a limitation is imposed by the number of EPROM cells which are coupled to a particular bit line.

Typically each device input is divided into an inverting and a non-inverting word line inputs forming the row lines of the array matrix. Therefore, at any given instant of time half of the EPROM cells on a bit line may be conducting. The speed performance is determined by the time required for a plurality of EPROM cells to change from a conducting state to a non-conducting state, or vice versa. The transition phase is dependent upon the number of unprogrammed (erased) EPROM cells selected in a certain column of an array. When multiple cells are conducting, a higher current flow occurs on the bit line which results in a faster discharge and a higher voltage swing between the "on" and "off" states. The increased voltage swing results in a longer period of time required for the bit line to stabilize to its "on" and "off" states, wherein ultimately affecting the speed performance of its device.

It is appreciated that what is needed is an improved circuit to increase the speed performance of an EPLD array by reducing the transistion period between "on" and "off" states on a bit line of the array.

SUMMARY OF THE INVENTION

The present invention describes an improved circuit to increase the response speed of EPROM cells arranged in an EPLD array. An architecture provides for a column of EPROM cells to have their drains coupled to a first bit line and their sources coupled to a second bit line. The first bit line is coupled to a sensing amplifier circuit which when enabled will sense the state of the first bit line.

The second bit line couples all of the sources to Vss through a current limiting transistor. The gate of the transistor is coupled to the sensing circuit and to the first bit line. Whenever multiple cells conduct, the higher current flow causes a feedback on the current limiting transistor which then limits the current being drawn.

By reducing the current, discharge from the sensing circuit is also reduced, which then causes a decrease in the voltage swing from "on" and "off" states. The decreased voltage swing translates to a faster transition time for the EPROM cells thereby achieving an improvement in the speed performance for the device.

BRIEF DESCRIPTION OF THE DRAWINGS

FIG. 2 is a prior art schematic diagram showing one EPROM column of an EPLD array.

FIG. 3 is a schematic diagram showing one EPROM column of an EPLD array utilizing the architecture of the present invention.

DETAILED DESCRIPTION OF THE PREFERRED EMBODIMENT

A current limited EPLD array architecture which improves the speed performance of EPLDs embodying EPROM technology is described. In the following description, numerous specific details are set forth such as specific transistors, EPROM cells, etc., in order to provide a thorough understanding of the present invention. It will be obvious, however, to one skilled in the art that the present invention may be practiced without these specific details. In other instances, well-known circuits have not been described in detail in order not to unnecessarily obscure the present invention. Further, although the preferred embodiment is described in conjunction with an EPROM PAL, it is evident to those skilled in the art that the present invention can be practiced with other devices which use a plurality of EPROM cells arranged onto a given bit line.

Figure 1:
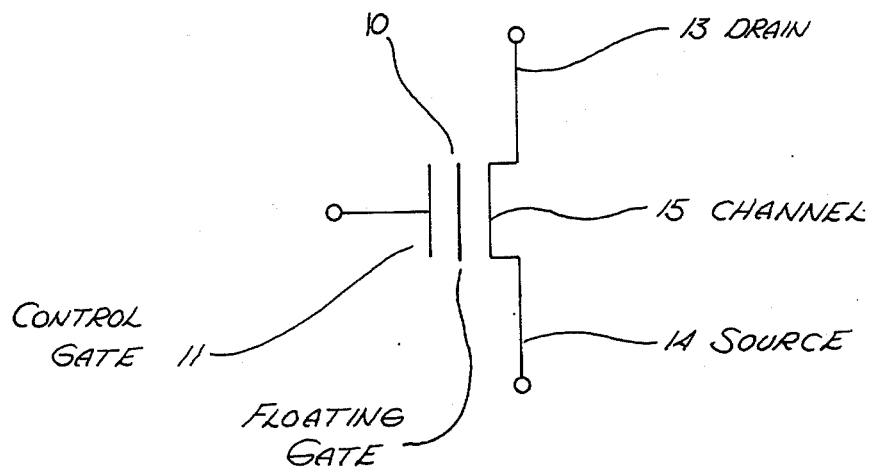
FIG. 1 is a schematic illustration of an EPROM cell.

Referring to FIG. 1, a MOS floating gate EPROM cell is shown. EPROM cell 10 is comprised of a device having a drain 13, source 14, control gate 11 and a floating gate 12. The manufacture of a typical floating gate EPROM cell 10 is wellknown in the prior art. The operation of EPROM 10 is also wellknown in the prior art. Floating gate 12 is in an uncharged state when cell 10 is unprogrammed. To program cell 10, a voltage higher in reference to the drain-source potential on drain 13 and source 14, is placed on control gate 11, wherein the charging voltage potential is placed between control gate 11 and drain 13. Electrons are attracted from channel 15 to floating gate 12. These electrons on floating gate 12 are trapped and remain trapped on floating gate 12 even after the removal of the charging voltage from control gate 11. The trapped electrons on floating gate 12 provide a higher charging voltage potential which remains on floating gate 12 as long as cell 10 is in the program state. The charging voltage applied to control gate 11 and the potential which remain on floating gate 12 are typically much higher in magnitude than the typical discrete voltage encountered during normal operations.

In operation, digital control signals are applied to control gate 11 to activate or deactivate cell 10. Typically these voltages encountered on control gate 11 are 0 and 5 volts. In the unprogrammed state, when the floating gate 12 is uncharged, the 0 and 5 volt digital control signals on control gate 11 determine the conduction or non-conduction of channel 15 of device 10. However, in the programmed state, when floating gate 12 is charged, the nonconduction of channel 15 is not controlled by the signal on control gate 11. When floating gate 12 is charged in the program state, channel 15 will not conduct any current and cell 10 will exhibit a non-conducting (or charged) state. When floating gate 12 is uncharged (erased), then cell 10 will respond according to the control signal input to the control gate 11.

Referring to FIG. 2, a portion of an EPLD array 20 showing one column of a prior art array structure is illustrated. The array 20 is comprised of a stack of EPROM cells 21 organized in a column such that the drains of the plurality of EPROM cells 21 are coupled together to bit line 22. Word line inputs which provide the row select signals of a matrix are each coupled to the gate of its respective cell 21. FIG. 2 shows only four cells 21 being coupled to the first three word lines WL1-WL3 and the EPROM cell 21 of the last stage having word line WLn. The number of EPROM cells 21 within a column of the array 20 is arbitrary and varies according to the particular device. The source of the various EPROM cells 21 are coupled to Vss, which in this circuit is ground. The drains of the EPROM cells 21 are coupled to bit line 22 which is then coupled to a column enable and sensing circuit 25. Circuit 25 may be one of a variety of prior art sensing amplifiers utilized in activating a column for performing a reading operation on the cells 21. In FIG. 2, an enable signal coupled to circuit 25 on line 26 will activate the bit line 22 and cells 21 of the same column of array 20. An output signal on line 27 couples the information on bit line 22 to other circuitry (not shown) which is used to process the information on bit line 22.

In operation each of the EPROM cells 21 functions equivalently to the EPROM cell 10 of FIG. 1. When any of the EPROM cells 21 are programmed, that programmed cell 21 is indifferent to a signal present on its respective word line. However, when a particular cell is unprogrammed (erased), the conduction of that device will depend on the signal present on its respective word line. In FIG. 2, five volts on a particular word line will turn on its respective cell and permit current conduction from source to drain in that particular device if the cell is unprogrammed. Therefore, in FIG. 2, anywhere from 0 to n number of cells may be conducting at any given time. Typically, though, in most present array architecture the even numbered word lines are an inversion of odd numbered word lines. For example, in FIG. 2, WL2 is an inverted signal of WL1. Typically in most arrays, as many as 50% of the cells may be conducting at any given period of time if all cells are unprogrammed. When a particular cell 21 is conducting, the conducting cell effectively places a ground on bit line 22, whereby a given value of current is drawn through that particular device 21. Assuming that each cell draws approximately the same value of current, the amount of current drawn from circuit 25 on bit line 22 will be equivalent to the conduction current of a given cell 21 multiplied by the number of cells which are conducting.

Referring to FIG. 3, a portion of an EPLD array 30 showing a column of EPROM cells 31 is shown. Each of the EPROM cells 31 forming a portion of array 30 functions equivalently to the EPROM cells described in FIG. 1. The column of EPROM cells 31 is configured such that each control gate is coupled to its respective word line WL1-WL2. The number of cells 31 within a column of the array 30 is arbitrary and varies according to the particular device. The drains of the various cells 31 are coupled together to bit line 32, as was the case with the drains in the prior art circuit of FIG. 2. Bit line 32 is then coupled to sensing amplifier circuit 35 of the present invention. The sources of cells 31, instead of being coupled to Vss as was the case in the prior art, are coupled together to drain of transistor 37. The source of transistor 37 is coupled to Vss, which in the preferred embodiment is ground. The gate of transistor 37 is coupled to circuit 35.

The sensing circuit 35 of the preferred embodiment is used to enable the column of cells 31. The circuit is coupled to an input transition detect circuitry, which detects an input change and provides an enable signal to the column sense amplifier circuit 35. The circuit 35 of the preferred embodiment is comprised of transistors 40–43. Bit line 32 is coupled to source of transistor 40 and gate of transistor 42. The drain of transistor 40 is coupled to the source of transistor 41, gate of transistor 37, as well as to output line 39. The gate of transistor 40 is coupled to the drain of transistor 42 which is then coupled to the source of transistor 43. Transistors 37, 41–43 are n-channel devices, however, p-channel devices can be used instead. The gates of transistor 41 and 43 are coupled to enable line 38, which when activated by an enable signal will turn on circuit 35 to activate bit line 32. The drain of transistor 41 and drain of transistor 43 are coupled to Vcc. Line 39 couples the reading of bit line 32 to other circuitry (not shown), which can be of a variety of circuits for processing the signal from bit line 32.

In operation, when circuit 35 is enabled by a signal on line 38, transistors 40 and 41 conduct to read the state of bit line 32. When circuit 35 is turned on, a sensing of bit line 32 takes place. If none of the EPROM cells are conducting, such as a case when all of the cells 31 are in a programmed state, then bit line 32 will register a high state. However, if any of the cells 31 are conducting, then bit line 32 will register a low state. In FIG. 2, the amount of current drawn from circuit 25 on line 22 was directly dependent on the number of EPROM cells conducting at a given time. The circuit of FIG. 3 of the present invention provides for a current limiting property to limit the maximum current which is drawn on bit line 32 from circuit 35. The sources of EPROM cells 31 are coupled together through transistor 37 instead of being coupled directly to Vss as was the case with the EPROM cells 21 of FIG. 2. Transistor 37 operates as a current controller to control the maximum current drawn through it. As shown in FIG. 3, the column of cells in the figure of the new architecture has two bit lines 32 and 33. Line 33 couples the sources of the various EPROM cells 31 to the drain of transistor 37. The gate of transistor 37 is coupled to bit line 32 through transistor 40.

The voltage level of bit line 32 has a range of conducting levels that are a function of the number of cells 31 which are conducting. Minimum current flow occurs when one cell 31 is in an erased state and the rest are programmed. Maximum current flow occurs when all cells 31 are erased and are selected. As more cells 31 commence to conduct, the bit line voltage level on line 32 decreases, which results in the reduction of the gate drive of the current limiting transistor 37. As the gate drive of the current limiting transistor 37 is reduced, less current is allowed to flow through transistor 37 and bit line 33, wherein limiting the maximum current which is drawn through the source-drain of various cells 31. Therefore, transistor 37 which controls the current being drawn through line 33 is tied to bit line 32 for the purpose of providing a negative feedback to control the amount of current flow on line 32.

Figure 4:
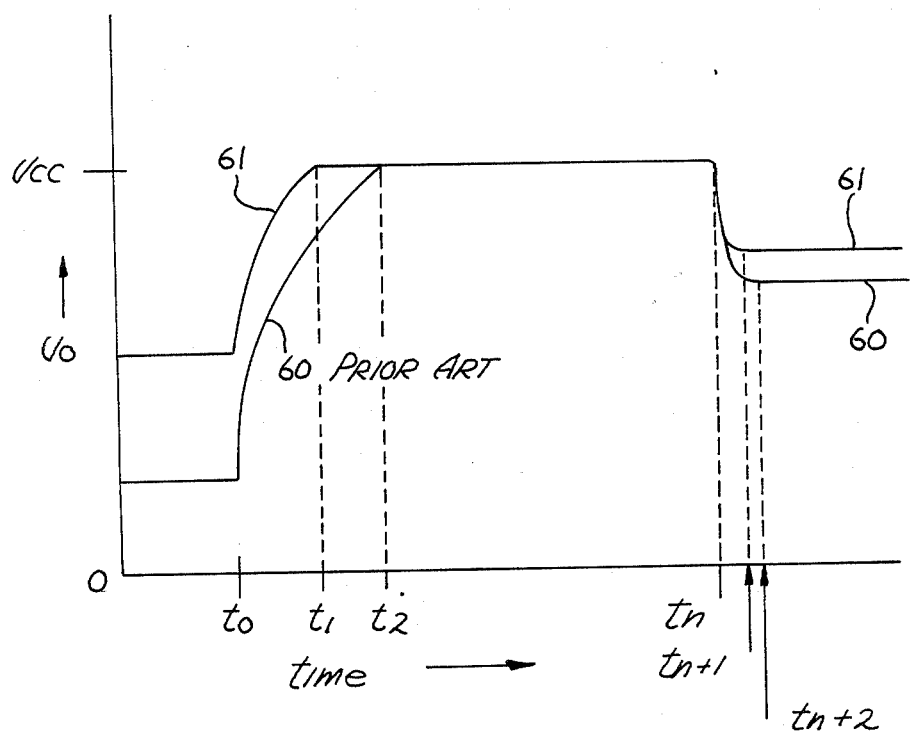
FIG. 4 is a graphic representation making a comparison of the responses from the circuits of FIGS. 2 and 3.

An advantage of utilizing the architecture of FIG. 3 is significant when considering the speed performance of the EPLD product. Referring to FIG. 4, it shows a comparison of the speed performance of the prior art circuit of FIG. 2 to the architecture of the present invention as shown in FIG. 3. The sensing circuit 35 changes states when the inputs driving the word lines WL1-WLn change in such a way that the bit line 33 goes from a state where one or more EPROM cells are conducting to a state where no cells are conducting. When no cells are conducting the bit lines 22 and 32 start to charge toward Vcc. The time required to charge toward Vcc is one determining factor of the speed performance of the product. Therefore, the speed performance is a direct function of how many EPROM cells were conducting in the previous state. FIG. 4 shows two curves 60 and 61. Curve 60 and 61 are shown for the purpose of comparing the response of the prior art circuit of FIG. 2 and the architecture of FIG. 3. The graph is a voltage Vo verses time representation of a signal on output lines 27 and 39. Curve 60 applies to the prior art circuit of FIG. 2 and curve 61 applies to the present architecture of FIG. 3.

Prior to time $t_0$ each curve 60 and 61 shows the condition when maximum current is drawn from its respective sensing circuits 25 and 35, when a certain same number of selected cells are in the erased state. Due to the presence of transistor 37 in FIG. 3, the maximum current is limited by a feedback voltage on the gate of transistor 37, which limits the amount of discharge by circuit 35. The prior art circuit draws a higher current permitting Vo on line 27 to discharge to a much lower value. At time $t_0$ both sensing circuits 25 and 35 are forced to change states such that none of the EPROM cells 21 and 31 are conducting. The respective circuits 25 and 35 charge toward Vcc. However, curve 61 reaches the Vcc value at time $t_1$ and curve 60 reaches Vcc at a later time $t_2$. Curve 61 reaches Vcc in a lesser time due to the shorter voltage swing from the voltage at $t_0$ and Vcc. By observing FIG. 4, it shows graphically the advantage of utilizing a current controlling transistor to limit the maximum current drawn from a particular column of an EPROM array. By limiting the maximum current, a discharge of the bit line is controlled to present a lesser of a voltage swing in the circuit of FIG. 3, wherein it takes less time for the bit line to change states.

FIG. 4 also shows a condition when only one EPROM cell is conducting. Again due to the feedback on the gate of transistor 37, the current flow is controlled in the circuit 35 as compared to the prior art circuit 25. At time $t_n$, one cell is forced to conduct in the circuits of FIGS. 2 and 3. The circuit of the preferred embodiment reaches a stabilized "on" state at time $T_{n+1}$, whereas due to the longer voltage transition the prior art Circuit reaches its stabilized "on" state at a later time $t_{n+2}$.

Although comparisons of only two transition states are illustrated in FIG. 4, it is appreciated that various voltage levels corresponding to a number of conduction states exist other than the two extremity cases shown by curves 60 and 61. It is also understood that a minimum "on" state, as shown at time $t_{n+1}$ of Curve 61, must have a voltage level which clearly needs to transition past a threshold "on" value so that a state change is registered. The decrease in the time required to change states, especially during a worst case condition when a maximum number of cells are conducting, results in an improvement of the speed performance of EPLDs.

Thus, an improved architecture for EPROM cells arranged in an array is described.

We claim:

1. An erasable programmable logic device comprising:
   a plurality of memory cells coupled to various input signal lines;
   a first bit line coupled to a first side of each of said memory cells;
   a second bit line coupled to a second side of each of said memory cells;
   a sensing amplifier coupled to said first bit line such that said sensing amplifier monitors current flow on said first bit line;
   current controlling means coupled to said second bit line wherein total current flow through said plurality of memory cells also flows through said sensing amplifier and said current controlling means;
   said current controlling means also coupled to said sensing amplifier such that said current flow determines a drive of said current controlling means for maintaining a predetermined current limit on said current flow.

2. The device of claim 1, wherein said current controlling means is a transistor.

3. The device of claim 2, wherein said memory cells are electrically programmable read only memories.

4. An erasable programmable logic device having a plurality of electrically programmable read only memory (EPROM) cell transistors, comprising:
   a sensing amplifier coupled to a voltage source;
   a first bit line coupled to said sensing amplifier and to drains of said EPROM cells;
   a second bit line coupled to sources of said EPROM cells;
   a current limiting transistor coupled in series between said second bit line and a return for said voltage source wherein total current flow through said plurality of memory cell transistors also flows serially through said sensing amplifier and said current limiting transistor;
   said current limiting transistor having its gate coupled to said sensing amplifier for receiving a feedback signal which determines a gate drive of said current limiting transistor such that said current limiting transistor maintains a predetermined current limit of said current flow to control discharge of said first bit line which provides for a faster response speed of said memory cell transistors.

5. The device of claim 4, wherein said EPROM cells form one column of a row-column matrix array;
   said array having a duplication of said bit lines, sensing amplifier and current limiting transistor for each said column.

6. The device of claim 5, wherein said second bit line is coupled to a drain and a ground coupled to source of said current limiting transistor.

7. In an erasable programmable logic device having a plurality of electrically programmable read only memory having a plurality of cells arranged in a row and column matrixed array wherein each column having cell transistors which have first sides coupled to a bit line which is coupled to a sensing amplifier and gates coupled to various input lines and improvement comprising:
   a current controlling transistor coupled serially between second sides of said cell transistors and ground and having its gate drive coupled to monitor current flow on said bit line such that said current controlling transistor limits maximum value of said current flow on said bit line to a predetermined value, wherein control of said maximum value of said current controls discharge of said bit line which provides for a faster response speed of said cell transistors.

* * * * *